United States Patent
Park

(10) Patent No.: US 9,502,651 B2
(45) Date of Patent: Nov. 22, 2016

(54) ELECTRONIC DEVICE INCLUDING A SEMICONDUCTOR MEMORY THAT INCLUDES RESISTANCE VARIABLE LAYERS DISPOSED BETWEEN AN ODD-NUMBERED STRUCTURE AND AN EVEN-NUMBERED STRUCTURE, AND METHOD FOR FABRICATING THE SAME

(71) Applicant: SK HYNIX INC., Icheon (KR)

(72) Inventor: Hae-Chan Park, Icheon (KR)

(73) Assignee: SK HYNIX INC., Icheon (KR)

( * ) Notice: Subject to any disclaimer, the term of this patent is extended or adjusted under 35 U.S.C. 154(b) by 517 days.

(21) Appl. No.: 14/103,490

(22) Filed: Dec. 11, 2013

(65) Prior Publication Data

US 2015/0039785 A1 Feb. 5, 2015

(30) Foreign Application Priority Data

Aug. 1, 2013 (KR) .................. 10-2013-0091498

(51) Int. Cl.
*H01L 45/00* (2006.01)
*H01L 27/22* (2006.01)
*H01L 27/24* (2006.01)

(52) U.S. Cl.
CPC ............ *H01L 45/16* (2013.01); *H01L 27/222* (2013.01); *H01L 27/2481* (2013.01); *H01L 45/06* (2013.01); *H01L 45/08* (2013.01); *H01L 45/124* (2013.01); *H01L 45/141* (2013.01); *H01L 45/146* (2013.01); *H01L 45/147* (2013.01)

(58) Field of Classification Search
CPC ....... H01L 45/06; H01L 45/08; H01L 45/16; H01L 45/124; H01L 45/141; H01L 45/146; H01L 45/147; H01L 27/222; H01L 27/2481
See application file for complete search history.

(56) References Cited

U.S. PATENT DOCUMENTS

| | | | |
|---|---|---|---|
| 8,502,343 B1* | 8/2013 | Jha | H01L 45/08 257/536 |
| 2009/0040802 A1* | 2/2009 | Arakawa | B82Y 10/00 365/51 |
| 2009/0137112 A1* | 5/2009 | Tabata | H01L 27/2409 438/631 |
| 2010/0237320 A1* | 9/2010 | Nagashima | H01L 27/101 257/5 |
| 2012/0063196 A1* | 3/2012 | Kim | G11C 13/0004 365/148 |
| 2013/0175496 A1* | 7/2013 | Choi | H01L 27/2472 257/5 |
| 2013/0248798 A1* | 9/2013 | Yi | H01L 45/04 257/2 |

FOREIGN PATENT DOCUMENTS

KR  10-2011-0062908 A  6/2011

* cited by examiner

*Primary Examiner* — Eric Oberly

(57) ABSTRACT

An electronic device includes a semiconductor memory. The semiconductor memory includes an odd-numbered layer structure disposed over a substrate and including a plurality of first lines which extend in a first direction; an even-numbered layer structure disposed over the substrate and including a plurality of second lines which extend in a second direction crossing the first direction; and resistance variable layers interposed between the first lines, between the second lines, and between the first lines and the second lines, wherein the odd-numbered layer structure and the even-numbered layer structure are alternately stacked over the substrate.

21 Claims, 19 Drawing Sheets

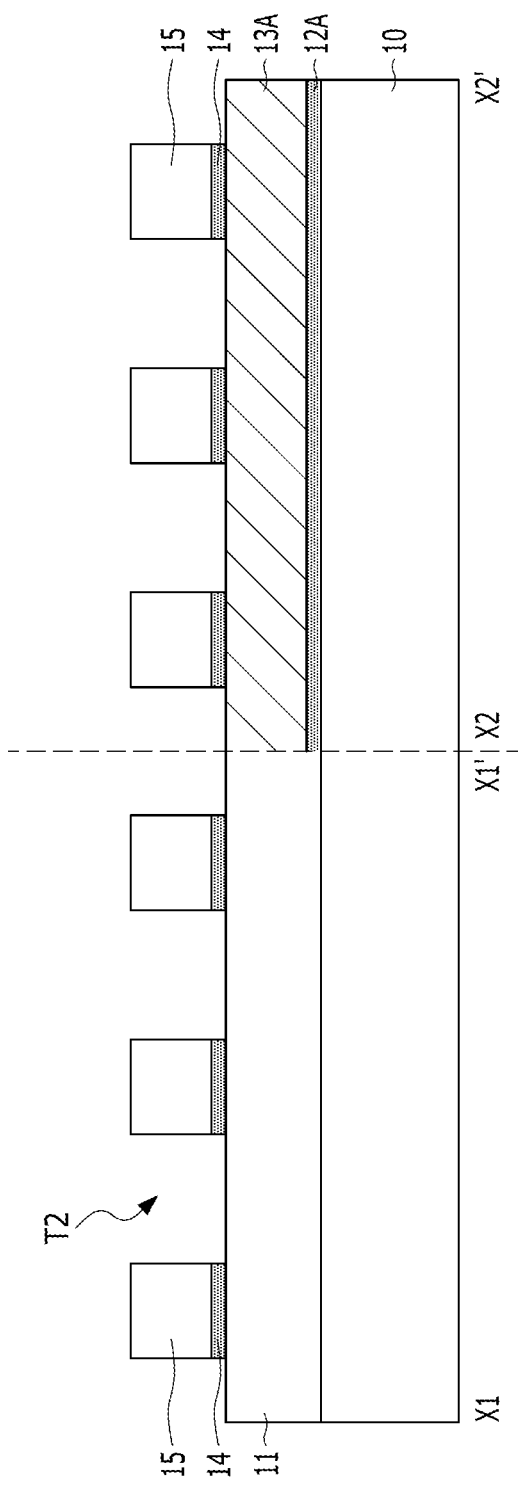

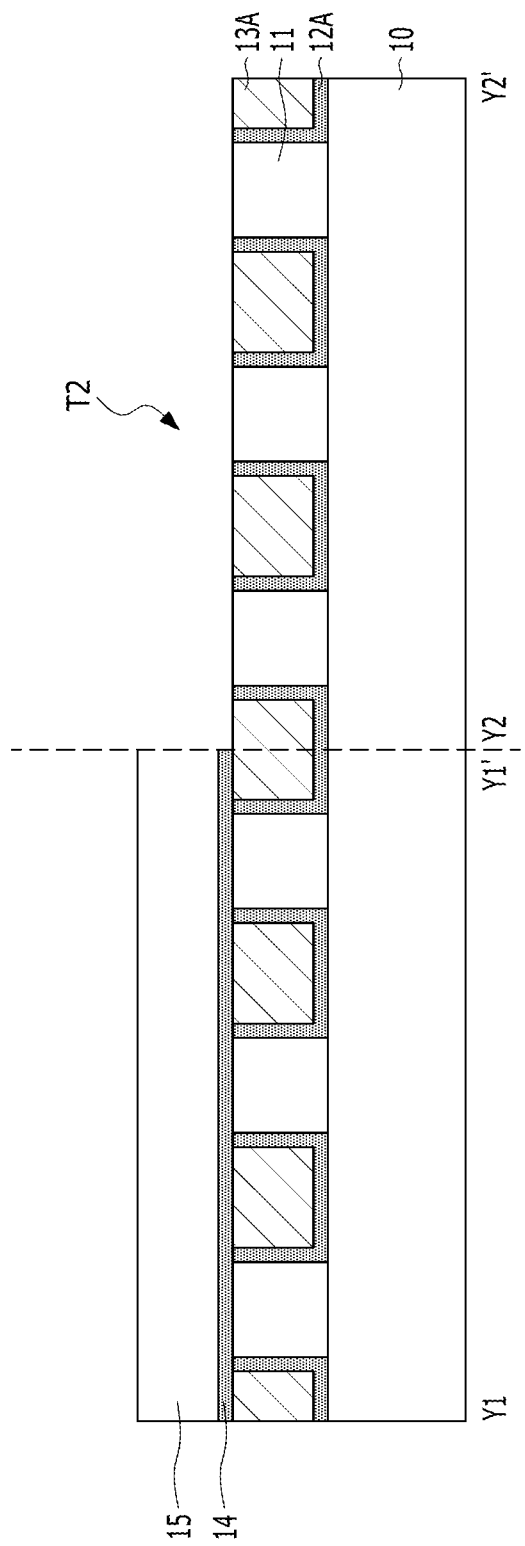

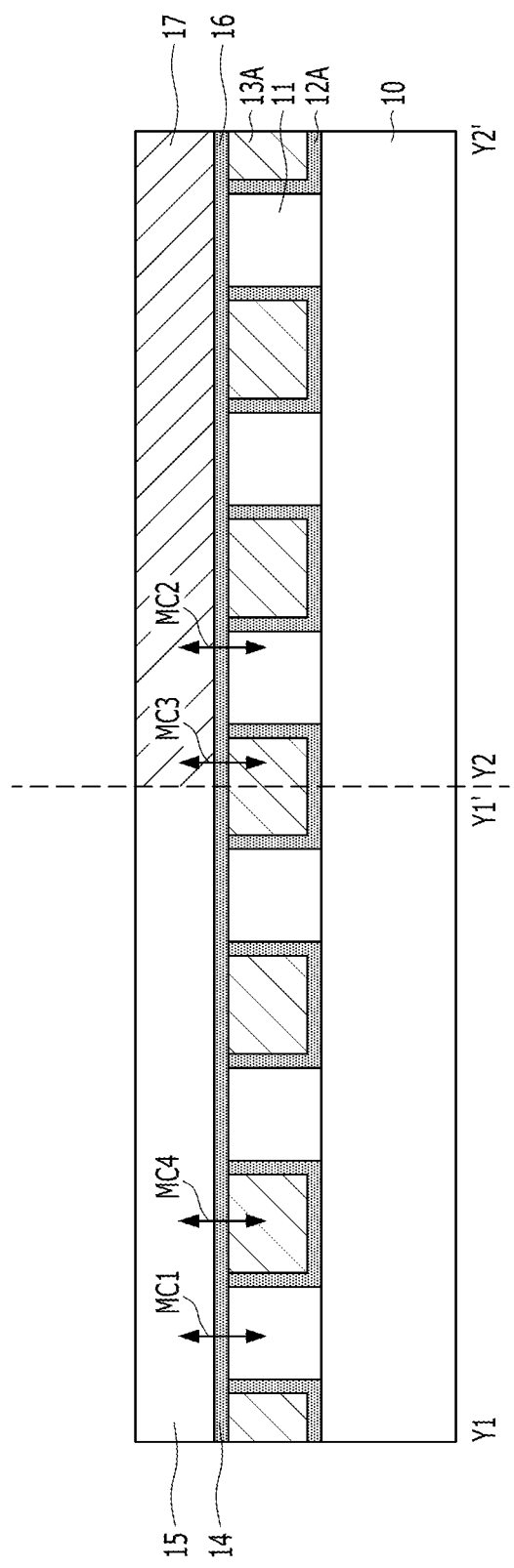

ELECTRONIC DEVICE INCLUDING A SEMICONDUCTOR MEMORY THAT INCLUDES RESISTANCE VARIABLE LAYERS DISPOSED BETWEEN AN ODD-NUMBERED STRUCTURE AND AN EVEN-NUMBERED STRUCTURE, AND METHOD FOR FABRICATING THE SAME

CROSS-REFERENCE TO RELATED APPLICATIONS

The present application claims priority of Korean Patent Application No. 10-2013-0091498, filed on Aug. 1, 2013, which is incorporated herein by reference in its entirety.

BACKGROUND

1. Field

The present disclosure relates to memory circuits and devices and their application in electronic devices and systems.

2. Description of the Related Art

As the trend in developing electronic appliances is towards miniaturization, low power consumption, high performance, multi-functionality, and so on, semiconductor devices capable of storing information in various electronic appliances such as computers, portable communication devices, and so on, are increasingly in demand. Semiconductor devices store data by being switched between different resistance states depending on a voltage or current applied thereto. Such semiconductor devices include RRAM (resistive random access memory), PRAM (phase change random access memory), FRAM (ferroelectric random access memory), MRAM (magnetic random access memory), E-fuses, etc.

SUMMARY

Embodiments are directed to memory circuits and devices and their applications in electronic devices and systems, various implementations of an electronic device in which the electronic device has an increased degree of integration, simplified manufacturing processes, and reduced processing costs, and a method for fabricating the memory circuits or devices.

In an embodiment, an electronic device may include a semiconductor memory, the semiconductor memory including: an odd-numbered layer structure stacked alternately with an even-numbered layer structure over a substrate, and including a plurality of first lines which extend in a first direction; the even-numbered layer structure including a plurality of second lines which extend in a second direction crossing with the first direction; and a resistance variable layer interposed between the first lines, between the second lines and between the first lines and the second lines.

Implementations of the above electronic device may include one or more the following.

The semiconductor memory may include: A part of the resistance variable layer between the first lines and the second lines is switched between different resistant states according to voltages or current applied through the first lines and the second lines. Memory cells are formed at respective crossing regions of the first lines and the second lines. A part of the resistance variable layer between the first lines isolates the first lines from one another, and a part of the resistance variable layer between the second lines isolates the second lines from one another. At least ones of the first lines and the second lines comprise even lines and odd lines which are alternately disposed, the even lines have the same shape, and the odd lines have the same shape. Any one of each even line and each odd line has a shape of which width gradually increases in a downward direction, and the other has a shape of which width gradually decreases in the downward direction. At least ones of the first lines and the second lines comprise even lines and odd lines which are alternately disposed, and the resistance variable layer comprise an even resistance variable layer which overlaps with each of the even lines under each of the even lines and an odd resistance variable layer which covers both side surfaces and a bottom surface of each of the odd lines. A spacer is interposed between the even resistance variable layer and the even line, and the odd resistance variable layer. The odd-numbered layer structure comprises at least two odd-numbered layer structures which are stacked alternately with the even-numbered layer structure. The even-numbered layer structure comprises at least two even-numbered layer structures which are stacked alternately with the odd-numbered layer structure. The resistance variable layer comprises an oxygen-rich type metal oxide layer and an oxygen-deficient type metal oxide layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In an embodiment, a method is provided for fabricating an electronic device having a semiconductor memory. This method includes: forming first even lines which extend in a first direction, over a substrate; forming first odd resistance variable layers in first trenches defined between the first even lines so that each of the first odd resistance variable layers is formed along sidewalls and bottom surface of each of the first trenches, and first odd lines which are filled in the first trenches formed with the first odd resistance variable layers; forming second stack structures which extend in a second direction crossing with the first direction, over the first even lines, the first odd lines and the first odd resistance variable layers, wherein each of the second stacked structures include a second even resistance variable layer and a second even line which are stacked; and forming second odd resistance variable layers in second trenches defined between the second stack structures so that each of the second odd resistance variable layers is formed along sidewalls and bottom surface of each of the second trenches, and second odd lines which are filled in the second trenches formed with the second odd resistance variable layers.

Implementations of the above method may include one or more of the following.

The forming of the first odd resistance variable layers and the first odd lines comprises: forming a resistance variable material along an underlying profile over a resultant structure which is formed with the first even lines; forming a conductive material over the resistance variable material; and performing a planarization process such that the first even lines are exposed.

The forming of the second odd resistance variable layers and the second odd lines comprises: forming a resistance variable material along an underlying profile over a resultant structure which is formed with the second stack structures; forming a conductive material over the resistance variable material; and performing a planarization process such that the second stack structures are exposed.

The method may further include: forming first even resistance variable layers under the first even lines so that each of the first even resistance variable layers overlaps with each of the first even lines may be performed.

The forming of the first even resistance variable layers, the first even lines, the first odd resistance variable layers and the first odd lines, and the forming of the second stack structures, the second odd resistance variable layers and the second odd lines are alternately repeatedly performed.

The method may further include: before the forming of the second odd resistance variable layers, forming spacers on sidewalls of the second stack structures.

The method may further include: before the forming of the first odd resistance variable layers, forming spacers on sidewalls of first stack structures of the first even resistance variable layers and the first even lines.

These and other aspects, implementations and associated advantages are described in greater detail in the drawings, the description and the claims.

DETAILED DESCRIPTION

Figure 1A:
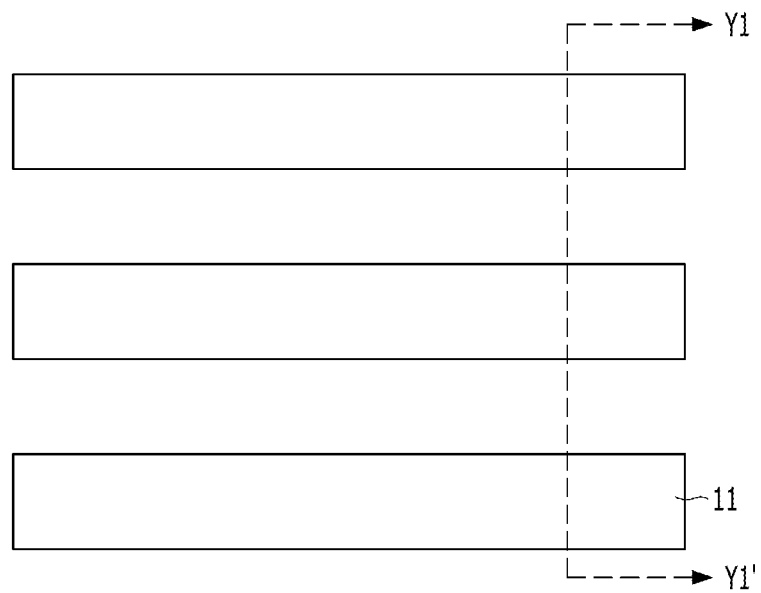
FIGS. 1A to 5C are views illustrating a semiconductor device and a method of fabricating the same in accordance with an embodiment of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible.

In addition, a described or illustrated example of a multilayer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A to 5C are views illustrating a semiconductor device and a method of fabricating the same in accordance with an embodiment of the present disclosure. Plan views and/or cross-sectional views are shown in FIGS. 1A to 5C, but embodiments are not limited thereto. For the sake of convenience in explanation, a resistance variable layer is not shown in the plan views.

First, a fabrication method will be described.

Figure 1B:
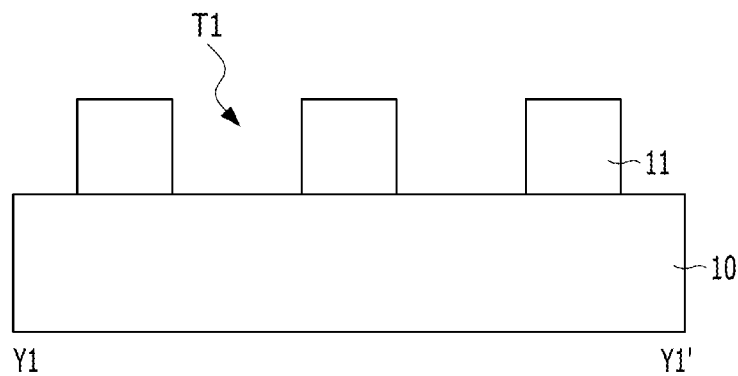

Referring to FIGS. 1A and 1B, first even lines 11, which extend in a first direction crossing a Y1-Y1' line), are formed on a substrate 10. The first even lines 11 have been termed as such in consideration of their relationship with first odd lines (see reference numeral 13A of FIGS. 4A to 4C), which will be described later. However, this terminology is merely for convenience of description to distinguish between features. That is, it would be equally accurate to refer to the lines 11 as odd lines and the lines 13A as the even lines. A space between every two neighboring first even lines 11 is referred to as a first trench T1.

The first even lines 11 may be formed by depositing a conductive material on the substrate 10 and selectively etching the conductive material. The conductive material for forming the first even lines 11 may include metal or metal nitride. The metal may be at least one of platinum (Pt), tungsten (W), aluminum (Al), copper (Cu), and tantalum (Ta), and the metal nitride may be titanium nitride (TiN) and/or tantalum nitride (TaN).

Figure 2:
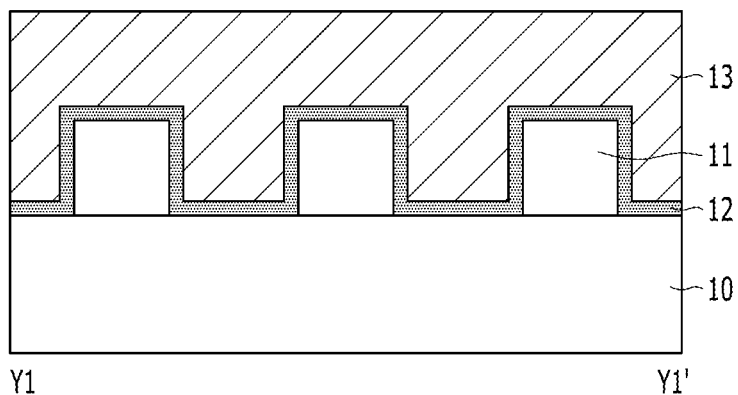

Referring to FIG. 2, after forming a resistance variable layer 12 along a surface profile of a resultant structure including the first even lines 11 formed on the substrate 10, a conductive material 13 is formed on the resistance variable layer 12 to sufficiently fill the first trenches T1.

The resistance variable layer 12 has a resistance variable characteristic. The resistance variable layer 12 may be formed as a single layer or as a multi-layer structure including a material used in an RRAM, a PRAM, an MRAM or an FRAM. That is, the resistance variable layer 12 may include perovskite-based oxide, metal oxide such as transition metal oxide, or a phase change material such as a chalcogenide compound, a ferroelectric material, or a ferromagnetic material.

In an embodiment, the resistance variable layer 12 includes a double layer in which an oxygen-deficient metal oxide layer and an oxygen-rich metal oxide layer are stacked. The oxygen-deficient metal oxide layer is a layer formed of $TiO_x$ (x<2) or $TaO_y$ (y<2.5), which is deficient in oxygen with consideration of their stoichiometry, and the oxygen-rich type metal oxide layer is a layer formed of $TiO_2$ and $Ta_2O_5$, which satisfies their respective stoichiometric ratios. If oxygen vacancies of the oxygen-deficient metal oxide layer are supplied to the oxygen-rich metal oxide layer, filament current paths are created in the oxygen-rich metal oxide layer by the oxygen vacancies. As a result, the resistance of the double layer including the oxygen-deficient metal oxide layer and the oxygen-rich metal oxide layer may be switched between a high resistance state and a low resistance state.

However, the present disclosure is not limited to the above embodiment. The resistance variable layer 12 may include any layer that has a resistance variable characteristic such that it may be switched between different resistance states according to a voltage or current applied thereto.

The conductive material 13 may include metal such as platinum (Pt), tungsten (W), aluminum (Al), copper (Cu), or tantalum (Ta), or metal nitride such as titanium nitride (TiN) or tantalum nitride (TaN).

Figure 3A:
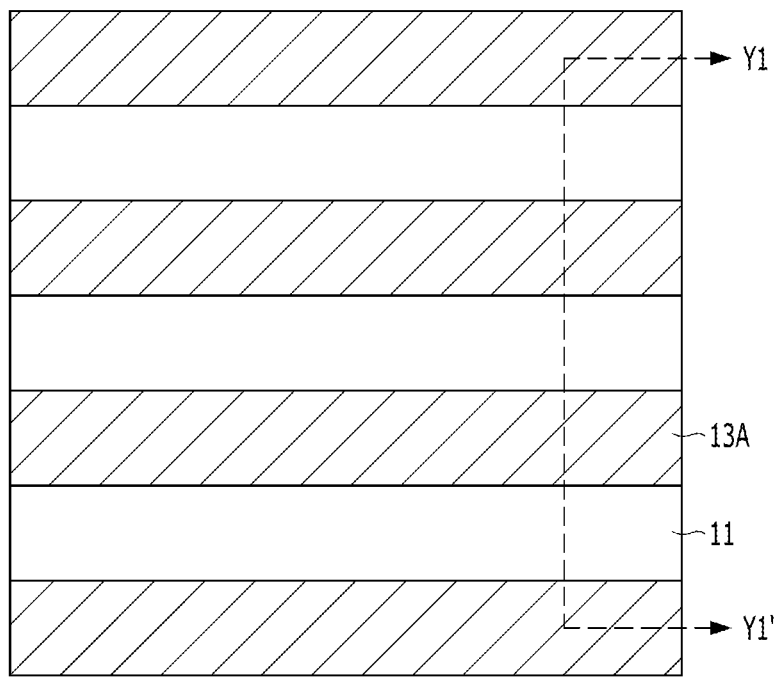
Figure 3B:
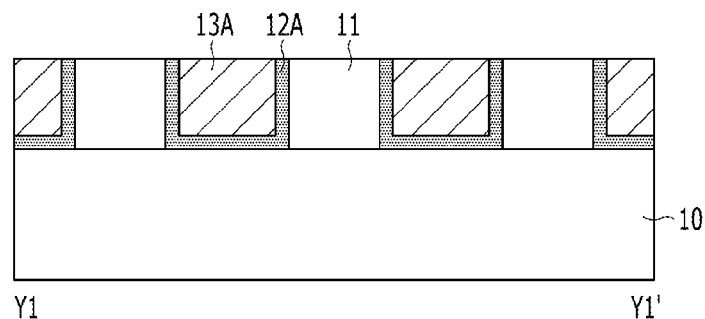

Referring to FIGS. 3A and 3B, a planarization process, for example, a CMP (chemical mechanical polishing) process, is performed on a resultant structure until the first even lines 11 are exposed. As a result, a first odd resistance variable layer 12A and first odd lines 13A are formed in the first trenches T1 between the first even lines 11. The first odd resistance variable layer 12A is formed on sidewalls and bottom surfaces of the first trenches T1, and the first odd lines 13A are formed to fill the first trenches T1 in which the first odd resistance variable layer 12A is formed. In other words, the first odd resistance variable layer 12A covers sidewalls and bottom surfaces of the first odd lines 13A. As a result of this process, the first even lines 11 and the first odd lines 13A are alternately disposed along a second direction parallel to the Y1-Y1' line while extending in the first direction.

By the above-described processes, a first layer structure, which includes the first even lines 11, the first odd lines 13A, and the first odd resistance variable layer 12A, is formed.

Figure 4A:
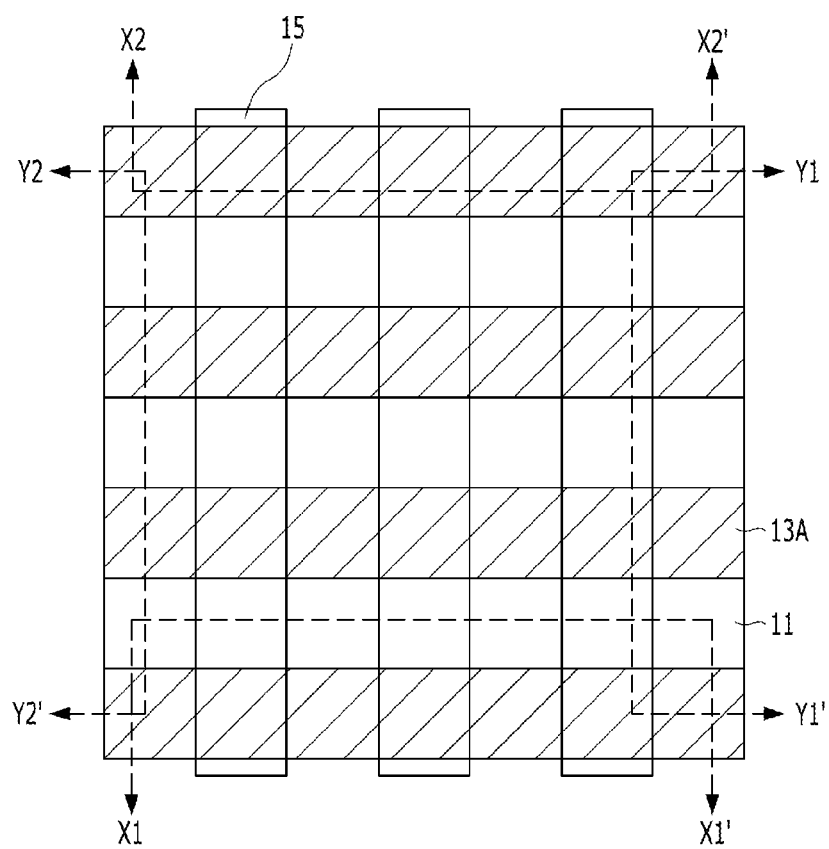

Referring to FIGS. 4A to 4C, a resistance variable material and a conductive material are sequentially formed on the first layer structure and then selectively etched to form stack structures of a second resistance variable layer 14 and second even lines 15, which extend in the second direction. A space between every two neighboring stack structures is referred to as a second trench T2.

Figure 5A:
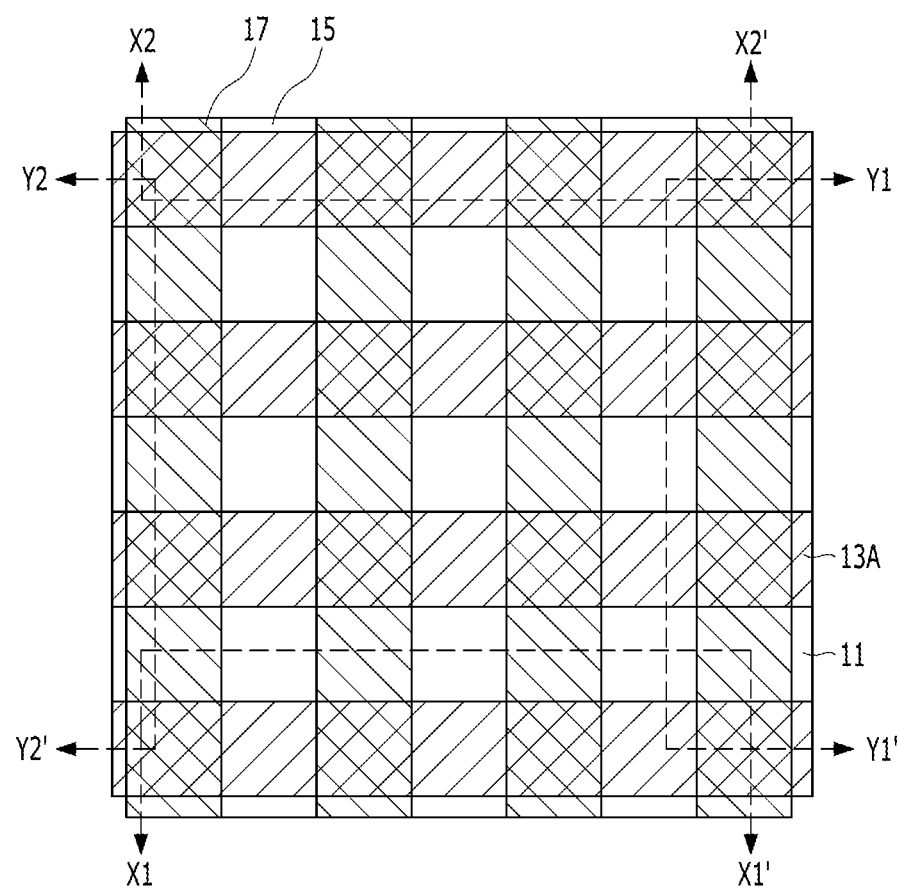
Figure 5B:
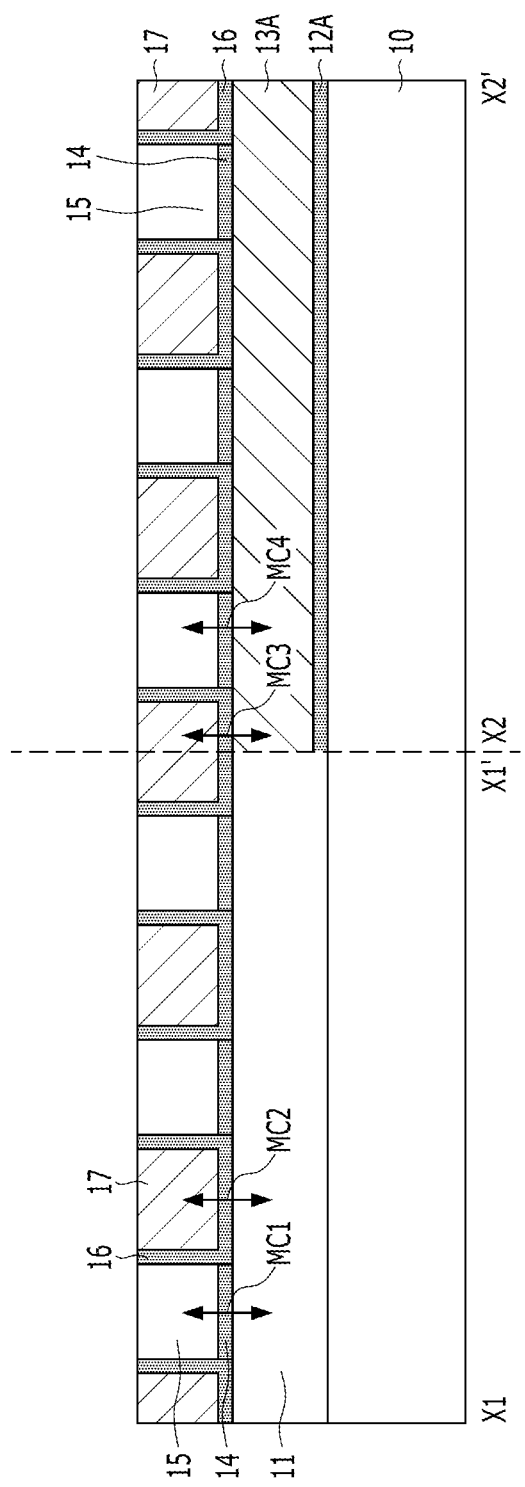

Referring to FIGS. 5A to 5C, a resistance variable material is formed along a surface profile of a resultant structure including the second even resistance variable layer 14 and the second even lines 15, and then a conductive material is formed to sufficiently fill the second trenches T2. After that, by performing a planarization process until the second even lines 15 are exposed, a second odd resistance variable layer 16 and a second odd line 17 are formed in each of the second trenches T2. As a result of this process, the second even lines 15 and the second odd lines 17 are alternately disposed along the first direction while extending in the second direction. The second even lines 15 and the second odd lines 17 have been termed as such for convenience of explanation. That is, it would be equally accurate to refer to the lines 17 as even lines, and the lines 15 as odd lines.

By the above-described processes, a second layer structure is formed on the first layer structure. The second layer structure includes the second even lines 15, the second odd lines 17, the second even resistance variable layer 14 interposed between the second even lines 15 and the first layer structure, and the second odd resistance variable layer 16 interposed between the second even lines 15 and the second odd lines 17 and between the second odd lines 17 and the first layer structure.

By the processes explained above, a semiconductor device is fabricated to include the first and second layer structures which are sequentially stacked on the substrate 10.

As shown in FIGS. 5A to 5C, the first layer structure includes the first even lines 11 and the first odd lines 13A, which extend in the first direction and are disposed to alternate in the second direction, and the second layer structure includes the second even lines 15 and the second odd lines 17, which extend in the second direction and are disposed to alternate in the first direction.

The first odd resistance variable layer 12A is interposed between the first even lines 11 and the first odd lines 13A, and the second even resistance variable layer 14 is interposed between the second even lines 15 and the first even lines 11 and between the second even lines 15 and the first odd lines 13A. The second odd resistance variable layer 16 is disposed between the second even lines 15 and the second odd lines 17, between the second odd lines 17 and the first even lines 11, and between the second odd lines 17 and the first odd lines 13A.

In such a case, the second even resistance variable layer 14 and the second odd resistance variable layer 16 are interposed between the first even lines 11 and the first odd lines 13A as lower lines and the second even lines 15 and the second odd lines 17 as upper lines. Accordingly, memory cells of the semiconductor device may be formed at respective crossing regions of the first even and odd lines 11 and 13A and the second even and odd lines 15 and 17. For example, first memory cells MC1 may be formed at the crossing regions of the first even lines 11 and the second even lines 15. The first memory cells MC1 may store data '0' or '1' by being switched between different resistance states by voltages or current applied to the first even lines 11 and the second even lines 15. Similarly, second memory cells MC2 may be formed at the crossing regions of the first even lines 11 and the second odd lines 17. Third memory cells MC3 may be formed at the crossing regions of the first odd lines 13A and the second odd lines 17. Fourth memory cells MC4 may be formed at the crossing regions of the first odd lines 13A and the second even lines 15.

The first odd resistance variable layer 12A disposed between the first even lines 11 and the first odd lines 13A may serve to isolate the first even lines 11 and the first odd lines 13A from each other, and the second odd resistance variable layer 16 disposed between the second even lines 15 and the second odd lines 17 may serve to isolate the second even lines 15 and the second odd lines 17 from each other.

In the embodiment shown in FIGS. 1 to 5C, no resistance variable layer is present under the first even lines 11 of the first layer structure, but the present invention is not limited thereto. In another embodiment, similarly to the second even resistance variable layer 14 of the second layer structure, a resistance variable layer patterned with the first even lines 11 may be disposed under the first even lines 11.

The semiconductor device and the method for fabricating the same shown in FIGS. 1 to 5C may have the following advantages.

First, since two lines, that is, an even line and an odd line, are formed in a 1 pitch of a layer structure, the degree of integration of the semiconductor device may be significantly increased.

Second, because any one of two lines, for example, an odd line, is self-aligned between even lines and a separate mask process for forming a resistance variable element is not required, a fabricating process of the semiconductor device is simple and easy, and thus processing costs may be reduced.

Figure 6:
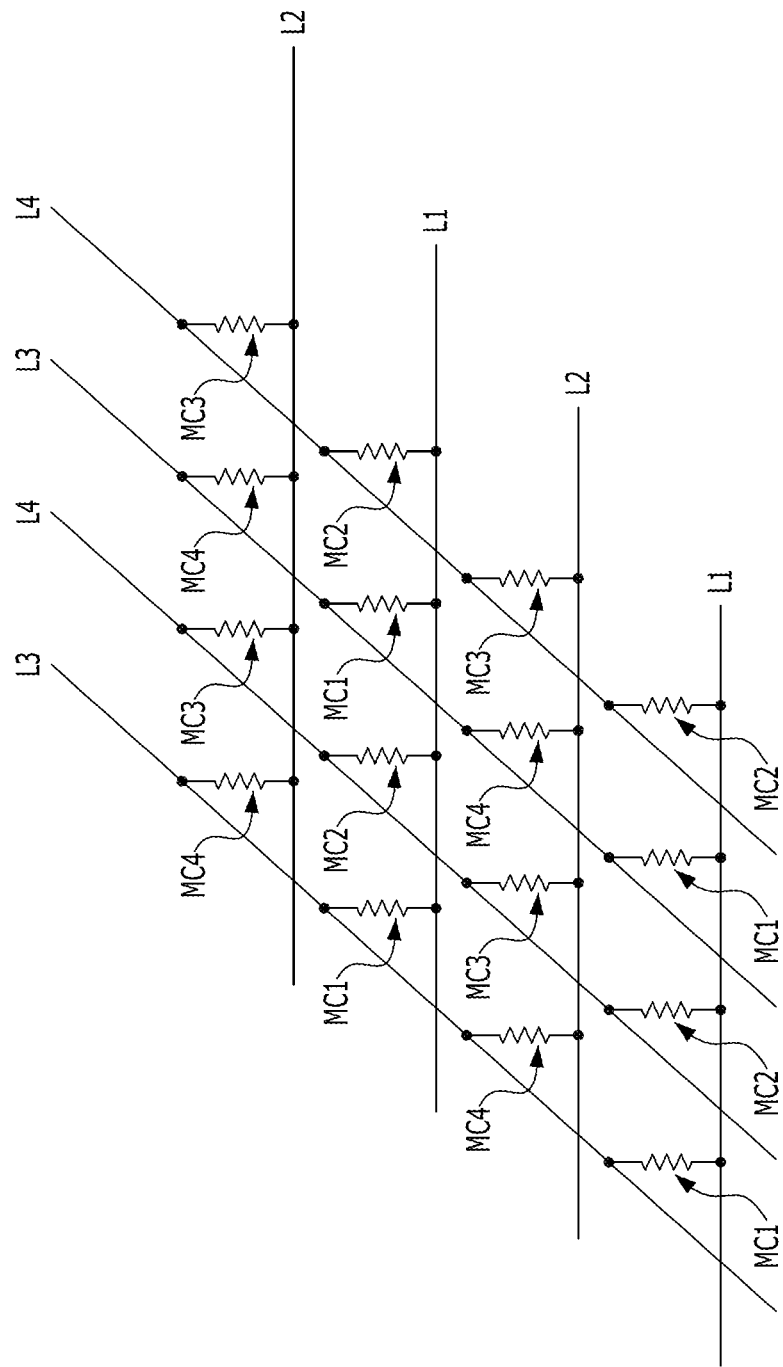
FIG. 6 is a circuit diagram corresponding to the semiconductor device illustrated in FIGS. 5A to 5C.

FIG. 6 is a circuit diagram corresponding to the semiconductor device illustrated in FIGS. 5A to 5C.

Referring to FIG. 6, memory cells MC1, MC2, MC3, and MC4 are formed between a plurality of first lines L1 and L2, which extend in a first direction, and a plurality of second lines L3 and L4, which extend in a second direction crossing the first direction, with resistance variable layers interposed therebetween.

The first lines L1 and L2 include first even lines L1 and first odd lines L2, which are alternately disposed, and the second lines L3 and L4 include second even lines L3 and second odd lines L4, which are alternately disposed. A resistance variable layer disposed between the first even lines L1 and the second even lines L3 may form the first memory cells MC1, a resistance variable layer disposed between the first even lines L1 and the second odd lines L4 may form the second memory cells MC2, a resistance variable layer disposed between the first odd lines L2 and the second odd lines L4 may form the third memory cells MC3, and a resistance variable layer disposed between the first odd lines L2 and the second even lines L3 may form the fourth memory cells MC4.

FIGS. 5A to 5C illustrate a stack structure of two layer structures, that is, a first layer structure including the first lines L1 and L2 and a second layer structure including the second lines L3 and L4. In another embodiment, the layer structure is repeatedly stacked. Hereinafter, a multi-stack structure in which a layer structure is repeatedly stacked over the two layer structures will be described with reference to FIGS. 7A to 8B.

Figure 7A:
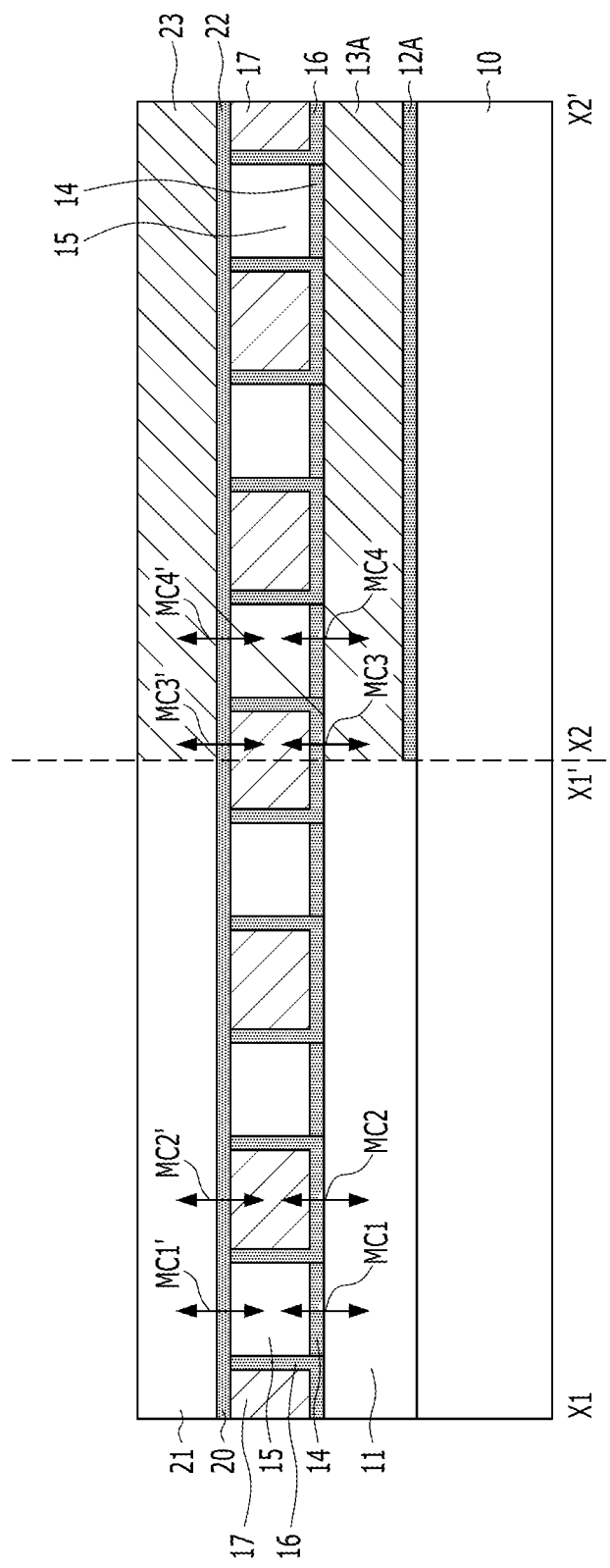
FIGS. 7A and 7B are cross-sectional views illustrating a semiconductor device including a multi-stack structure in accordance with an embodiment of the present disclosure.
Figure 7B:
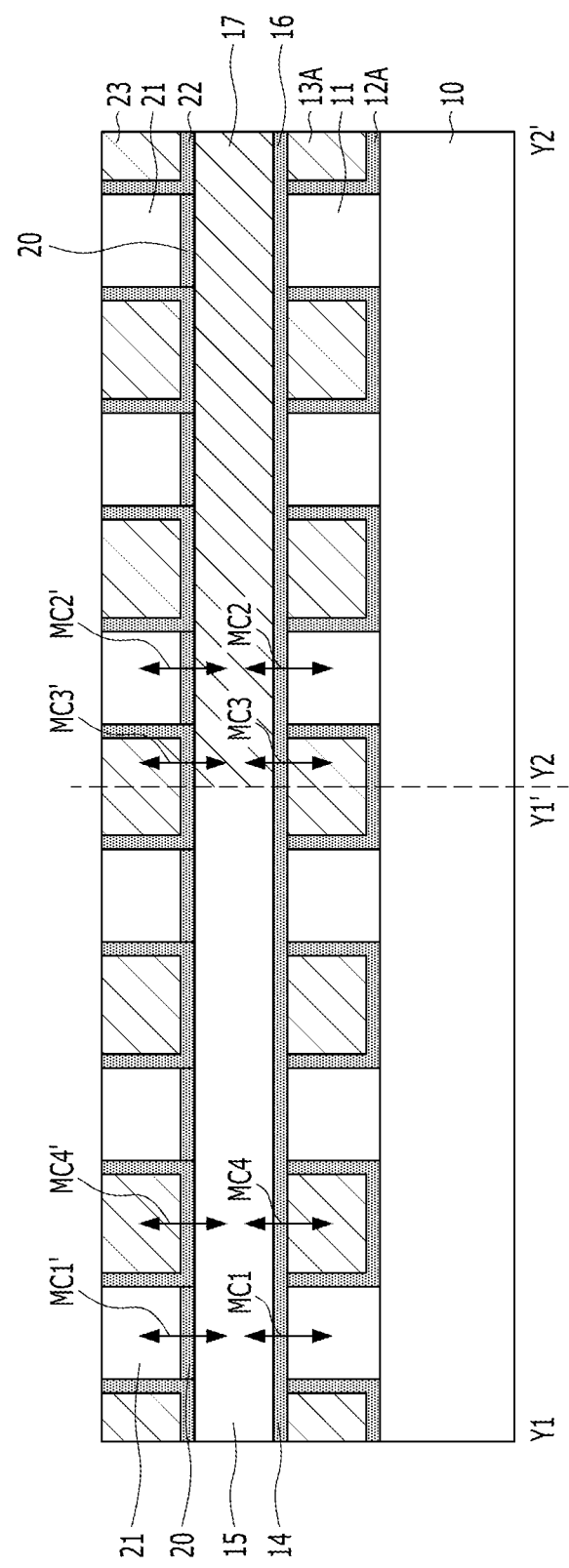

FIGS. 7A and 7B are cross-sectional views illustrating a semiconductor device including a multi-stack structure in accordance with an embodiment of the present disclosure.

Referring to FIGS. 7A and 7B, a third layer structure is disposed on the second layer structure illustrated in FIGS. 5B and 5C.

The third layer structure includes third even lines 21 and third odd lines 23, which extend in the first direction and are disposed to alternate in the second direction. The third layer structure also includes a third even resistance variable layer 20, which is disposed under the third even lines 21 to be aligned with the third even lines 21 and is interposed between the second layer structure and the third even lines 21, and a third odd resistance variable layer 22, which is formed to cover sidewalls and bottom surfaces of the third odd lines 23 and is disposed between the second layer structure and the third odd lines 23 and between the third even lines 21 and the third odd lines 23. Since a method for forming the third layer structure is substantially the same as the method for forming the second layer structure except that the direction in which the third even and odd lines 21 and 23 extend is substantially perpendicular to that of the second even and odd lines 15 and 17 shown in FIGS. 5B and 5C, detailed descriptions thereof will be omitted.

In an embodiment, the third even resistance variable layer 20 is interposed between the third even lines 21 and the second even and odd lines 15 and 17, and the third odd resistance variable layer 22 is interposed between the third odd lines 23 and the second even and odd lines 15 and 17. Accordingly, as shown in FIGS. 7A and 7B, memory cells MC1', M2C', MC3', and MC4' may be formed at respective crossing regions of the second even and odd lines 15 and 17 and the third even and odd lines 21 and 23.

Since an embodiment is implemented with three layer structures that are vertically stacked, the degree of integration of the semiconductor device may be increased.

Figure 8A:
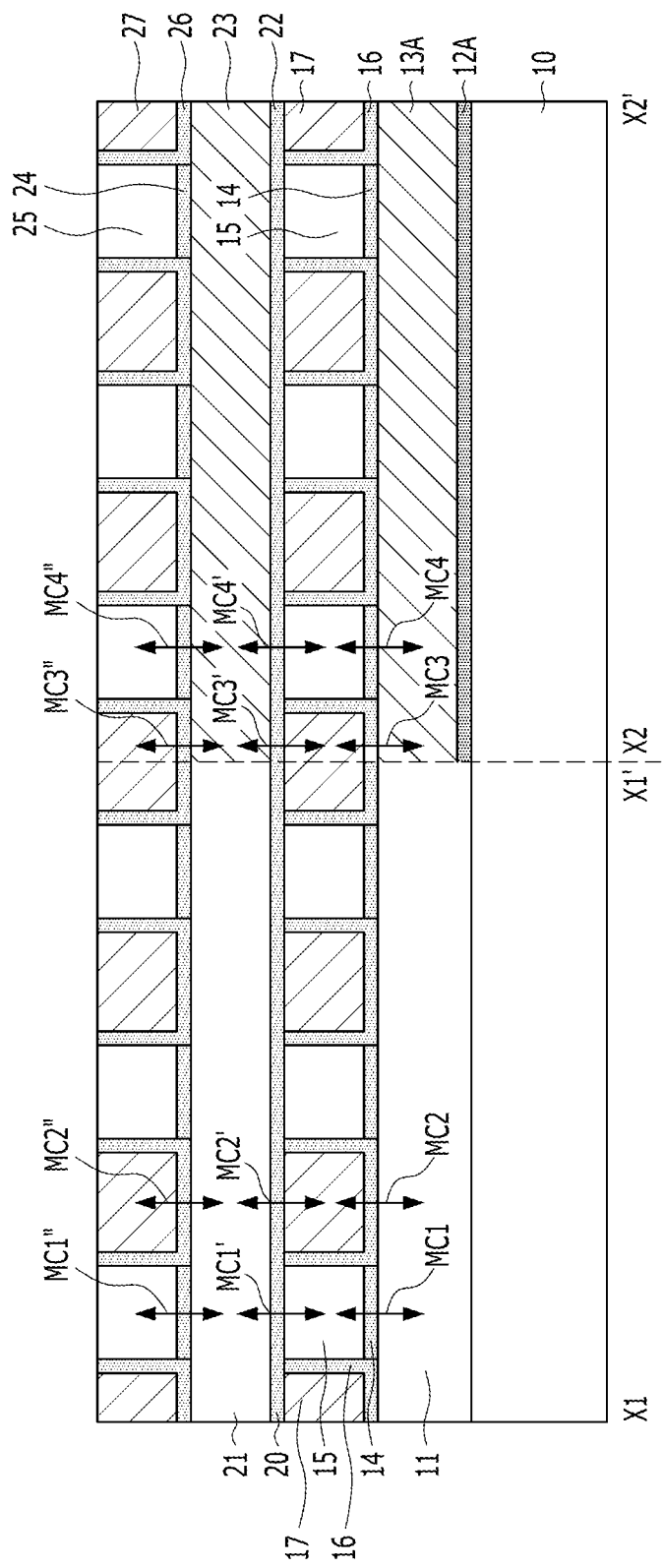
FIGS. 8A and 8B are cross-sectional views illustrating a semiconductor device including a multi-stack structure in accordance with another embodiment of the present disclosure.
Figure 8B:
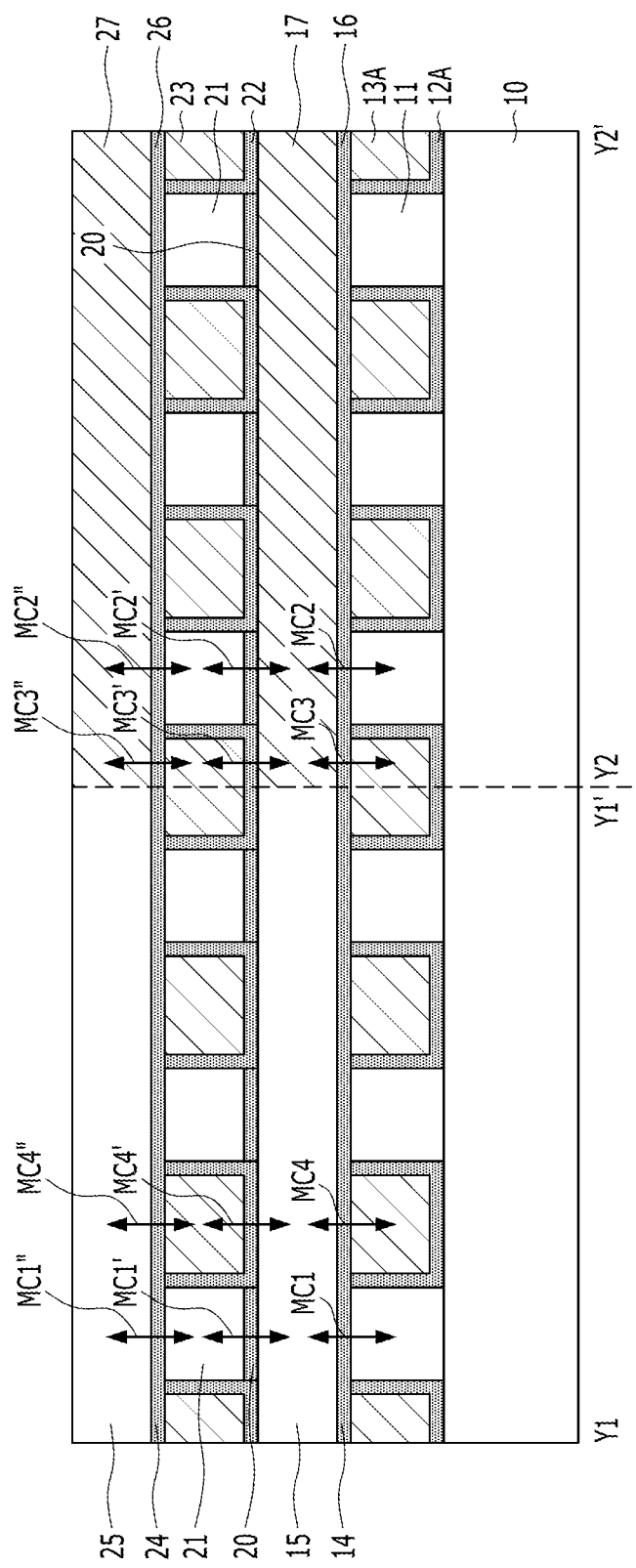

FIGS. 8A and 8B are cross-sectional views illustrating a semiconductor device including a multi-stack structure in accordance with another embodiment of the present disclosure.

Referring to FIGS. 8A and 8B, a fourth layer structure is disposed on the third layer structure illustrated in FIGS. 7A and 7B.

The fourth layer structure includes fourth even lines 25 and fourth odd lines 27, which extend in the second direction and are disposed to alternate in the first direction. The fourth layer structure also includes a fourth even resistance variable layer 24, which is disposed under the fourth even lines 25 to be aligned with the fourth even lines 25 and is interposed between the third layer structure and the fourth even lines 25, and a fourth odd resistance variable layer 26, which is formed to cover sidewalls and bottom surfaces of the fourth odd lines 27 and is interposed between the third layer structure and the fourth odd lines 27 and between the fourth even lines 25 and the fourth odd lines 27. Since a method for forming the fourth layer structure is substantially the same as the method for forming the second layer structure, detailed descriptions thereof will be omitted.

In this embodiment, memory cells MC1", M2C", MC3", and MC4" may be formed at respective crossing regions of the third even and odd lines 21 and 23 and the fourth even and odd lines 25 and 27.

Since an embodiment is implemented with four layer structures that are vertically stacked, the degree of integration of the semiconductor device may be further increased compared to that of a semiconductor device including two or three layer structures.

In a similar manner, in an embodiment, five or more layer structures may be stacked. Even and odd lines of respective layer structures, excluding the uppermost layer structure and/or the lowermost layer structure, may have entire surfaces extending in a direction, which are surrounded by resistance variable materials. For example, in the second even line 15, which extends in the second direction in the second layer structure, a bottom surface, both side surfaces and a top surface thereof are surrounded by resistance variable materials, i.e., the second even resistance variable layer 14, the second odd resistance variable layer 16, and the third even and odd resistance variable layers 20 and 22, respectively. Also, odd-numbered structures such as the first layer structure and the third layer structure include lines which extend in the same direction, for example, the first direction, and even-numbered structures, such as the second layer structure and the fourth layer structure, include lines which extend in the same direction, for example, the second direction. Resistance variable layers may be interposed between an odd-numbered structure and an even-numbered structure and between lines in each layer structure.

Figure 9:
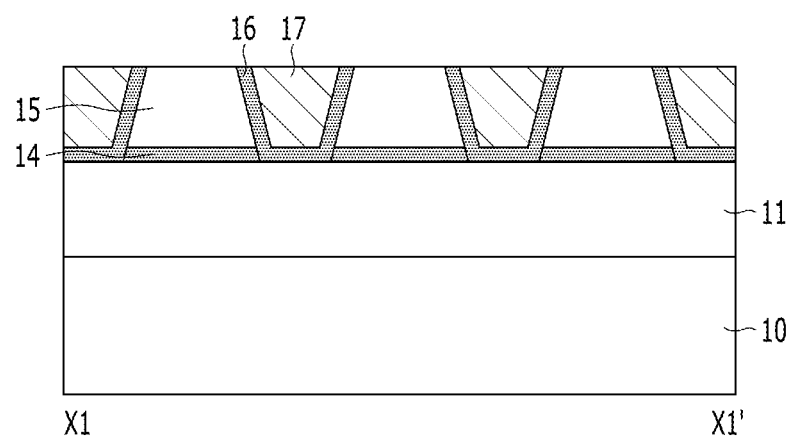
FIG. 9 is a cross-sectional view illustrating a semiconductor device in accordance with an embodiment of the present disclosure.

FIG. 9 is a cross-sectional view illustrating a semiconductor device in accordance with an embodiment of the present disclosure.

Referring to FIG. 9, since lines that are formed first in each layer structure, for example, second even lines 15 of the second layer structure, may be formed by etching, e.g., dry etching a conductive material, they may have a tapered profile in which the bottom surface of the line has a greater width than the top surface of the line. That is, the width of such lines gradually increases in the downward direction. Accordingly, second odd lines 17 disposed between the second even lines 15 may also have a tapered profile in which a width gradually decreases in the downward direction.

Although it is not shown, similar to FIG. 9, in another layer structure, lines that are formed first, for example, even lines, may have a width that gradually increases in the downward direction, and lines subsequently formed, for example, odd lines, may have a width that gradually decreases in the downward direction.

In an embodiment, spacers for preventing disturbance between cells may also be formed. Such an embodiment will be described with reference to FIG. 10.

Figure 10:
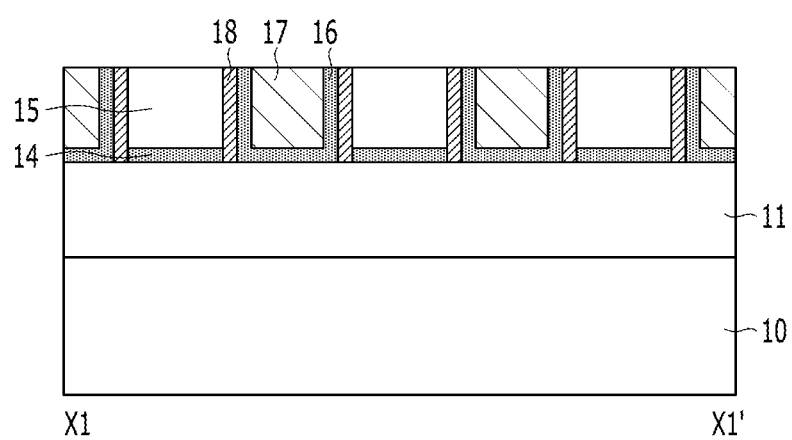
FIG. 10 is a cross-sectional view illustrating a semiconductor device in accordance with an embodiment of the present disclosure.

FIG. 10 is a cross-sectional view illustrating a semiconductor device in accordance with an embodiment of the present disclosure.

Referring to FIG. 10, after lines that are formed first in each layer structure, for example, the second even resistance variable layer 14 and the second even lines 15 of the second layer structure, are formed, spacers 18 are formed on sidewalls of the lines.

In an embodiment, a process for forming the spacers 18 includes forming a dielectric layer, for example, an oxide layer or a nitride layer, on a resultant structure including the second even resistance variable layer 14 and the second even lines 15, and then performing a blanket etching process on the dielectric layer.

In another embodiment, a process for forming the spacers 18 is performed by oxidizing sidewalls of the second even resistance variable layer 14 and the second even lines 15. The oxidation of the sidewalls of the second even resistance variable layer 14 and the second even lines 15 may be performed while masks (not shown) used in an etching process for forming the second even resistance variable layer 14 and the second even lines 15 are present. As a result, the oxidation of top surfaces of the second even lines 15 may be substantially prevented.

After forming the spacers 18 on the sidewalls of the second even resistance variable layer 14 and the second even lines 15, a process for forming a resistance variable material, a process for forming a conductive material, and a planarization process may be performed to form a second odd resistance variable layer 16 and second odd lines 17.

In the above embodiment, because the spacers 18 are interposed between the second even lines 15 and the second odd lines 17, disturbance between memory cells may be substantially prevented. Although not shown, similar to FIG. 10, spacers may be additionally formed on sidewalls of lines that are formed first in another layer structure as well.

A memory circuit or semiconductor device in accordance with an embodiment can be used in a range of electronic devices or systems. FIGS. 11 to 15 provide some examples of electronic devices or systems that include a memory circuit or semiconductor device in accordance with an embodiment.

Figure 11:
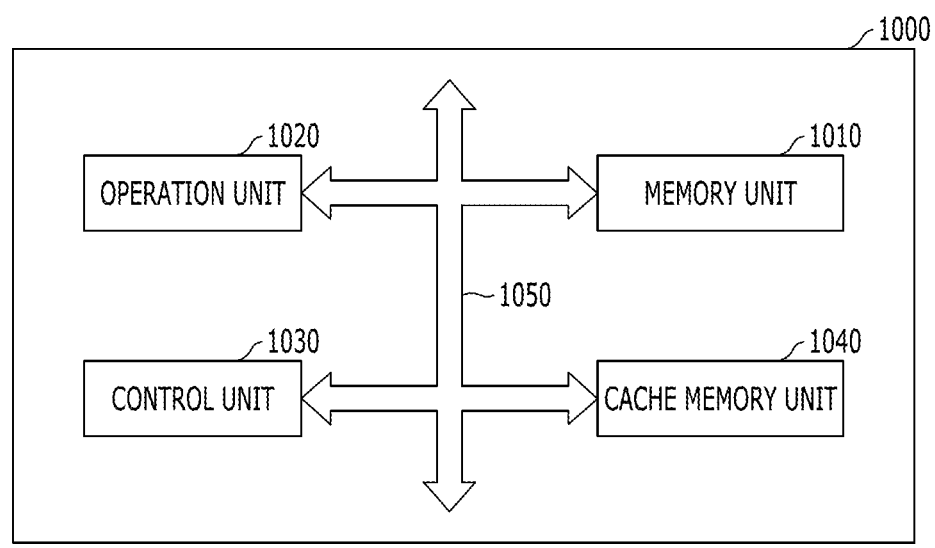
FIG. 11 illustrates a configuration of a microprocessor including a semiconductor device in accordance with an embodiment of the present disclosure.

FIG. 11 illustrates a configuration of a microprocessor including a semiconductor device in accordance with an embodiment of the present disclosure.

Referring to FIG. 11, the microprocessor 1000 may perform tasks for controlling and tuning a series of processes of receiving data from various external devices, processing the data, and outputting processing results to external devices. The microprocessor 1000 includes a memory unit 1010, an operation unit 1020, a control unit 1030, and so on. The microprocessor 1000 may be any of data processing units such as a central processing unit (CPU), a graphic processing unit (GPU), a digital signal processor (DSP), and an application processor (AP).

The memory unit 1010 stores data in the microprocessor 1000, as a processor register, a register, or the like. The memory unit 1010 may include a data register, an address register, a floating point register, or the like. The memory unit 1010 may include various registers. The memory unit 1010 may temporarily store data for which operations are to be performed by the operation unit 1020, resulting data of the operations, and addresses where data for performing the operations is stored.

The memory unit 1010 may include one or more semiconductor devices in accordance with embodiments of the present disclosure. For example, the memory unit 1010 may include an odd-numbered layer structure and an even-numbered layer structure over a substrate. The odd-numbered layer structure and the even-numbered layer structure are stacked. If there is more than one odd-numbered layer structure, the odd-numbered layer structures alternate with one or more even-numbered layer structures. The odd-numbered layer structure includes a plurality of first lines which extend in a first direction. The even-numbered layer structure includes a plurality of second lines which extend in a second direction crossing the first direction. The odd-numbered layer structure and the even-numbered layer structure further include resistance variable layers interposed between the first lines, between the second lines, and between the first lines and the second lines. By implementing the memory unit 1010 with a semiconductor device that includes the odd-numbered layer structure and the even-numbered layer structure, a fabrication process of the memory unit 1010 may be simplified, and the degree of integration of the memory unit 1010 may be increased. As a consequence, a size of the microprocessor 1000 may be reduced.

The operation unit 1020 may perform four arithmetical operations or logical operations based on results that the control unit 1030 decodes commands. The operation unit 1020 may include at least one arithmetic logic unit (ALU).

The control unit 1030 may receive signals from the memory unit 1010, the operation unit 1020, and an external device of the microprocessor 1000, perform extraction, decoding of commands, and controlling input and output of signals of the microprocessor 1000, and execute processing represented by programs.

The microprocessor 1000 also includes a cache memory unit 1040 which can temporarily store data inputted from an external device or data to be outputted to an external device. In this case, the cache memory unit 1040 may exchange data with the memory unit 1010, the operation unit 1020, and the control unit 1030 through a bus interface 1050.

Figure 12:
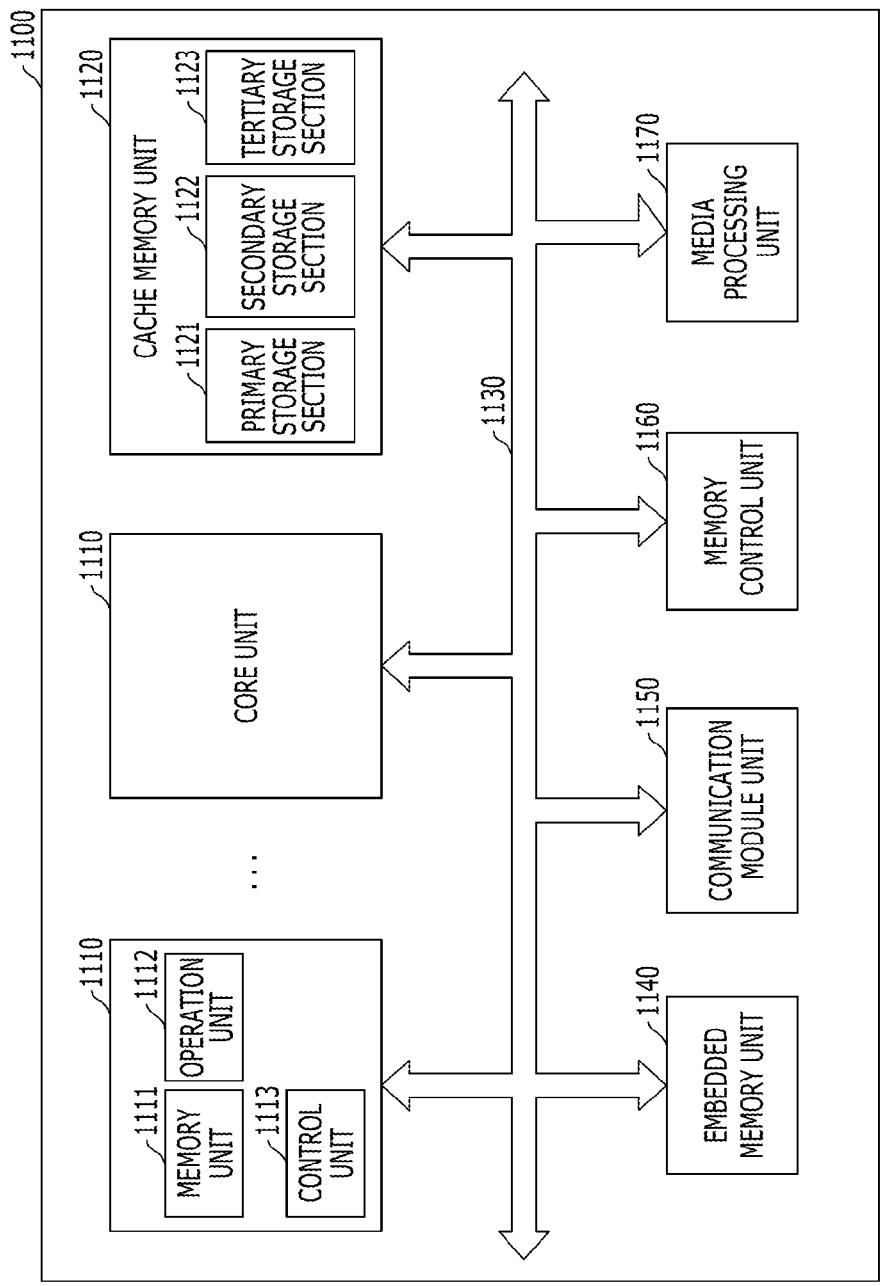
FIG. 12 illustrates a configuration of a processor including a semiconductor device in accordance with an embodiment of the present disclosure.

FIG. 12 illustrates a configuration of a processor including a semiconductor device in accordance with an embodiment of the present disclosure.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 includes a core unit 1110 which serves as the microprocessor, a cache memory unit 1120 which serves to temporarily store data, and a bus interface 1130 for transferring data between internal and external devices. The processor 1100 may include various system-on-chips (SoCs) such as a multi-core processor, a graphic processing unit (GPU), and an application processor (AP).

The core unit 1110 may perform arithmetic logic operations for data inputted from an external device and includes a memory unit 1111, an operation unit 1112, and a control unit 1113.

The memory unit 1111 stores data in the processor 1100, as a processor register, a register, or the like. The memory unit 1111 may include a data register, an address register, a floating point register, or the like. The memory unit 1111 may include various registers. The memory unit 1111 may temporarily store data for which operations are to be performed by the operation unit 1112, resulting data of the operations, and addresses where data for performing of the operations are stored. The operation unit 1112 performs operations in the processor 1100. The operation unit 1112 may perform four arithmetic operations, logical operations based on commands decoded by the control unit 1113, or the like. The operation unit 1112 may include at least one arithmetic logic unit (ALU). The control unit 1113 may receive signals from the memory unit 1111, the operation unit 1112, and an external device of the processor 1100, perform extraction, decoding of commands, controlling input and output of signals of processor 1100, and execute processing represented by programs.

The cache memory unit 1120 may temporarily store data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 when high storage capacity is required. As the occasion demands, the cache memory unit 1120 may include an increased number of storage sections. That is to say, the number of storage sections which are included in the cache memory unit 1120 may be changed according to the design of the processor 1100. The primary, secondary, and tertiary storage sections 1121, 1122, and 1123 may have the same processing speed or different processing speeds. If the speeds of the storage sections 1121, 1122, and 1123 are different, the speed of the primary storage section 1121 may be highest.

At least one storage section of the primary storage section 1121, the secondary storage section 1122, and the tertiary storage section 1123 of the cache memory unit 1120 may include one or more semiconductor devices in accordance with embodiments of the present disclosure. For example, the cache memory unit 1120 may include an odd-numbered layer structure and an even-numbered layer structure over a substrate. The odd-numbered layer structure and the even-numbered layer structure are stacked. If there is more than one odd-numbered layer structure, the odd-numbered layer structures alternate with one or more even-numbered layer structures. The odd-numbered layer structure includes a plurality of first lines which extend in a first direction. The even-numbered layer structure includes a plurality of second lines which extend in a second direction crossing the first direction. The odd-numbered layer structure and the even-numbered layer structure further include resistance variable layers interposed between the first lines, between the second lines and between the first lines and the second lines. By implementing the cache memory unit 1120 with a semiconductor device that includes an odd-numbered layer structure and an even-numbered layer structure, a fabrication process of the cache memory unit 1120 may be simplified, and a degree of integration of the cache memory unit 1120 may be increased. As a consequence, a size of the processor 1100 may be reduced.

Although FIG. 12 illustrates that all the primary, secondary, and tertiary storage sections 1121, 1122, and 1123 are disposed inside the cache memory unit 1120, the primary, secondary, and tertiary storage sections 1121, 1122, and 1123 of the cache memory unit 1120 may be disposed inside the core unit 1110 and may compensate for the difference in data processing speed between the core unit 1110 and the external device. In another embodiment, the primary storage section 1121 of the cache memory unit 1120 may be disposed inside the core unit 1110, and the secondary storage section 1122 and the tertiary storage section 1123 may be disposed outside the core unit 1110 to strengthen the function of compensating for the difference in data processing speed. In yet another embodiment, the primary and secondary storage sections 1121 and 1122 may be disposed inside the core unit 1110, and the tertiary storage section 1123 may be disposed outside the core unit 1110.

The bus interface 1130 connects the core unit 1110, the cache memory unit 1120, and external devices, and allows data to be efficiently transmitted.

The processor 1100 may include a plurality of core units 1110, and the plurality of core units 1110 may share the cache memory unit 1120. The plurality of core units 1110 and the cache memory unit 1120 may be directly connected or be connected through the bus interface 1130. If the processor 1100 includes the plurality of core unit 1110, the primary storage section 1121 may be disposed in each core unit 1110, and the secondary storage section 1122 and the tertiary storage section 1123 may be disposed outside the plurality of core units 1110 to be shared by the plurality of core units 1110 through the bus interface 1130. The processing speed of the primary storage section 1121 may be higher than the processing speeds of the secondary and tertiary storage section 1122 and 1123. In another embodiment, the primary storage section 1121 and the secondary storage section 1122 may be disposed in each core unit 1110, and the tertiary storage section 1123 may be disposed outside the plurality of core units 1110 to be shared by the plurality of core units 1110 through the bus interface 1130.

The processor 1100 may further include an embedded memory unit 1140 which stores data, a communication module unit 1150 which can transmit and receive data to and from an external device in a wired or wireless manner, a memory control unit 1160 which drives an external memory device, and a media processing unit 1170 which processes data processed in the processor 1100 or data inputted from an external input device and outputs the processed data to an external interface device. The processor 1100 may include a plurality of modules or devices. In an embodiment, the plurality of modules may exchange data with the core units 1110 and the cache memory unit 1120, and with one another, through the bus interface 1130.

The embedded memory unit 1140 may include, not only a volatile memory, but also a nonvolatile memory. The volatile memory may include a DRAM (dynamic random access memory), a mobile DRAM, an SRAM (static random access memory), or a memory with similar functions to those of the above mentioned memories. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or the like.

The communication module unit 1150 may include a module capable of being connected with a wired network, a module capable of being connected with a wireless network, or both. The wired network module may include a local area network (LAN), a universal serial bus (USB), an Ethernet, power line communication (PLC) such as various devices which send and receive data through transmission lines, or the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, or the like.

The memory control unit 1160 administrates and processes data transmitted between the processor 1100 and an external storage device operating according to a different communication standard from the processor 1100. The memory control unit 1160 may include any of various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process data processed in the processor 1100 or image data, voice data, and other data from the external input device, and output the processed data to the external interface device. The media processing unit 1170 may include a graphic processing unit (GPU), a digital signal processor (DSP), a high definition audio device (HD audio), a high definition multimedia interface (HDMI) controller, and so on.

Figure 13:
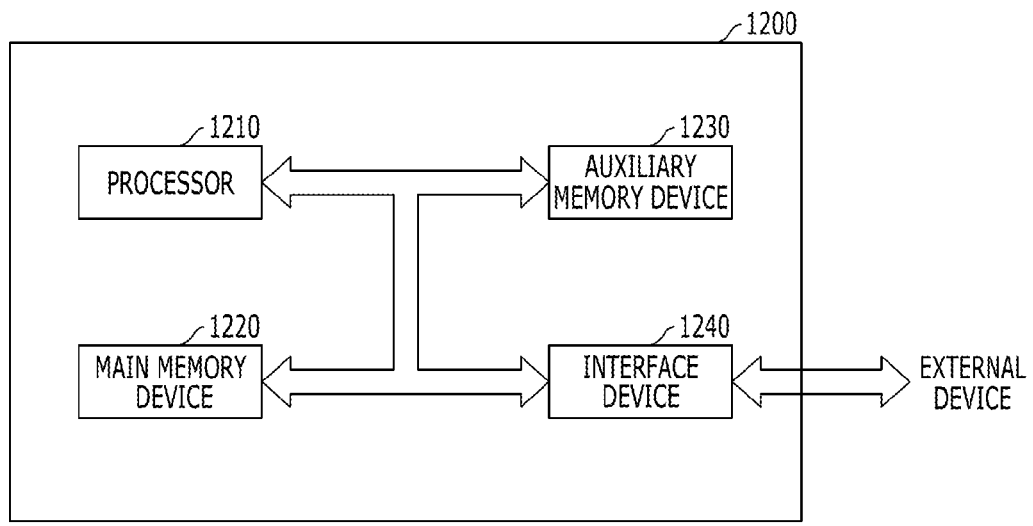
FIG. 13 illustrates a configuration of a system including a semiconductor device in accordance with an embodiment of the present disclosure.

FIG. 13 illustrates a configuration of a system including a semiconductor device in accordance with an embodiment of the present disclosure.

Referring to FIG. 13, the system 1200, as an apparatus for processing data, may perform input, processing, output, communication, storage, etc. to conduct a series of manipulations of data. The system 1200 includes a processor 1210, a main memory device 1220, an auxiliary memory device 1230, and an interface device 1240. The system 1200 may be any of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operations for data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), or the like.

The main memory device 1220 is a storage which can temporarily store, call, and execute program codes or data from the auxiliary memory device 1230 when programs are executed and can conserve memorized contents even when power is off. The main memory device 1220 may include one or more semiconductor devices in accordance with embodiments of the present disclosure. For example, the main memory device 1220 may include an odd-numbered layer structure and an even-numbered layer structure over a substrate. The odd-numbered layer structure and the even-numbered layer structure are stacked. If there is more than one odd-numbered layer structure, the odd-numbered layer structures alternate with one or more even-numbered layer structures. The odd-numbered layer structure includes a plurality of first lines which extend in a first direction. The even-numbered layer structure includes a plurality of second lines which extend in a second direction crossing the first direction. The odd-numbered layer structure and the even-numbered layer structure further include resistance variable layers interposed between the first lines, between the second lines, and between the first lines and the second lines. By implementing the main memory device 1220 with a semiconductor device that includes an odd-numbered layer structure and an even-numbered layer structure, a fabrication process of the main memory device 1220 may be simplified, and a degree of integration of the main memory device 1220 may be increased. As a consequence, a size of the system 1200 may be reduced.

The main memory device 1220 may further include a volatile memory such as a static random access memory (SRAM), a dynamic random access memory (DRAM), or the like.

In another embodiment, the main memory device 1220 may not include a semiconductor device according to an embodiment of the present disclosure but include a volatile memory such as a static random access memory (SRAM), a dynamic random access memory (DRAM), or the like.

The auxiliary memory device 1230 is a memory device for storing program codes or data. While the processing speed of the auxiliary memory device 1230 is lower than that of the main memory device 1220, the auxiliary memory device 1230 can store a larger amount of data than the main memory device 1220. The auxiliary memory device 1230 may include one or more semiconductor devices in accordance with embodiments of the present disclosure. For example, the auxiliary memory device 1230 may include an odd-numbered layer structure and an even-numbered layer structure over a substrate. The odd-numbered layer structure and the even-numbered layer structure are stacked. If there is more than one odd-numbered layer structure, the odd-numbered layer structures alternate with one or more even-numbered layer structures. The odd-numbered layer structure includes a plurality of first lines which extend in a first direction. The even-numbered layer structure includes a plurality of second lines which extend in a second direction crossing the first direction. The odd-numbered layer structure and the even-numbered layer structure further include resistance variable layers interposed between the first lines, between the second lines, and between the first lines and the second lines. By implementing the auxiliary memory device 1230 with a semiconductor device that includes an odd-numbered layer structure and an even-numbered layer structure, a fabrication process of the auxiliary memory device 1230 may be simplified, and a degree of integration of the auxiliary memory device 1230 may be increased. As a consequence, a size of the system 1200 may be reduced.

The auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

In another embodiment, the auxiliary memory device 1230 may not include a semiconductor device according to an embodiment of the present disclosure but include data storage systems such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may perform exchange of commands and data between the system 1200 and an external device. The interface device 1240 may include one or more of a keypad, a keyboard, a mouse, a speaker, a microphone, a display, various human interface devices (HIDs), a communication device, and so on. The communication device may include a module capable of being connected with a wired network, a module capable of being connected with a wireless network, or both. The wired network module may include a local area network (LAN), a universal serial bus (USB), an Ethernet, power line communication (PLC), such as various devices which send and receive data through transmission lines, and so on. The wireless network module may include one or more of Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
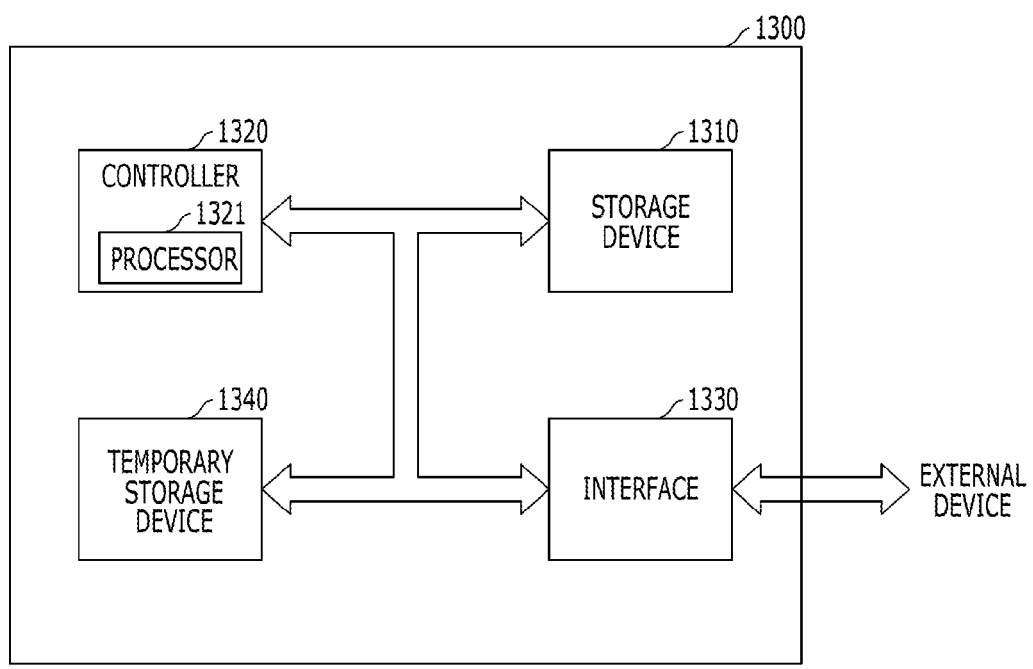
FIG. 14 illustrates a configuration of a data storage system including a semiconductor device in accordance with an embodiment of the present disclosure.

FIG. 14 illustrates a configuration of a data storage system including a semiconductor device in accordance with an embodiment of the present disclosure.

Referring to FIG. 14, the data storage system 1300 includes a storage device 1310 which has a nonvolatile characteristic as a component for storing data, a controller 1320 which controls the storage device 1310, an interface 1330 for connection with an external device, and a temporary storage device 1340 for storing data temporarily.

The data storage system 1300 may be a disk type device or a card type device. The disk type device may include any of a hard disk drive (HDD), a compact disc read only memory (CDROM), a digital versatile disc (DVD), a solid state disk (SSD), and so on, and the card type device may include any of a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory such as a ROM (read only memory), a NOR flash memory, a NAND flash memory, a phase change random access memory (PRAM), a resistive random access memory (RRAM), a magnetic random access memory (MRAM), or the like.

The controller 1320 may control exchange of data between the storage device 1310 and the interface 1330. The controller 1320 includes a processor 1321 for performing an operation for and processing commands inputted through the interface 1330 from an outside of the data storage system 1300.

The interface 1330 performs exchange of commands and data between the data storage system 1300 and the external device. If the data storage system 1300 is a card type device, the interface 1330 may be compatible with interfaces which are used in devices such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. If the data storage system 1300 is a disk type device, the interface 1330 may be compatible with interfaces such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on. The interface 1330 may be compatible with one or more different types of interfaces.

The temporary storage device 1340 can store data temporarily for efficiently transferring data between the interface 1330 and the storage device 1310 according to diversification and high performance of an interface with an external device, a controller, and a system. The temporary storage device 1340 may include one or more semiconductor devices in accordance with embodiments of the present disclosure. The temporary storage device 1340 may include an odd-numbered layer structure and an even-numbered layer structure over a substrate. The odd-numbered layer structure and the even-numbered layer structure are stacked. If there is more than one odd-numbered layer structure, the odd-numbered layer structures alternate with one or more even-numbered layer structures. The odd-numbered layer structure includes a plurality of first lines which extend in a first direction. The even-numbered layer structure includes a plurality of second lines which extend in a second direction crossing the first direction. The odd-numbered layer structure and the even-numbered layer structure further include resistance variable layers interposed between the first lines, between the second lines, and between the first lines and the second lines. By implementing the temporary storage device 1340 with a semiconductor device that includes an odd-numbered layer structure and an even-numbered layer structure, a fabrication process of the temporary storage device 1340 may be simplified, and a degree of integration of the temporary storage device 1340 may be increased. As a consequence, a size of the data storage system 1300 may be reduced, and a data storage characteristic of the data storage system 1300 may be improved.

Figure 15:
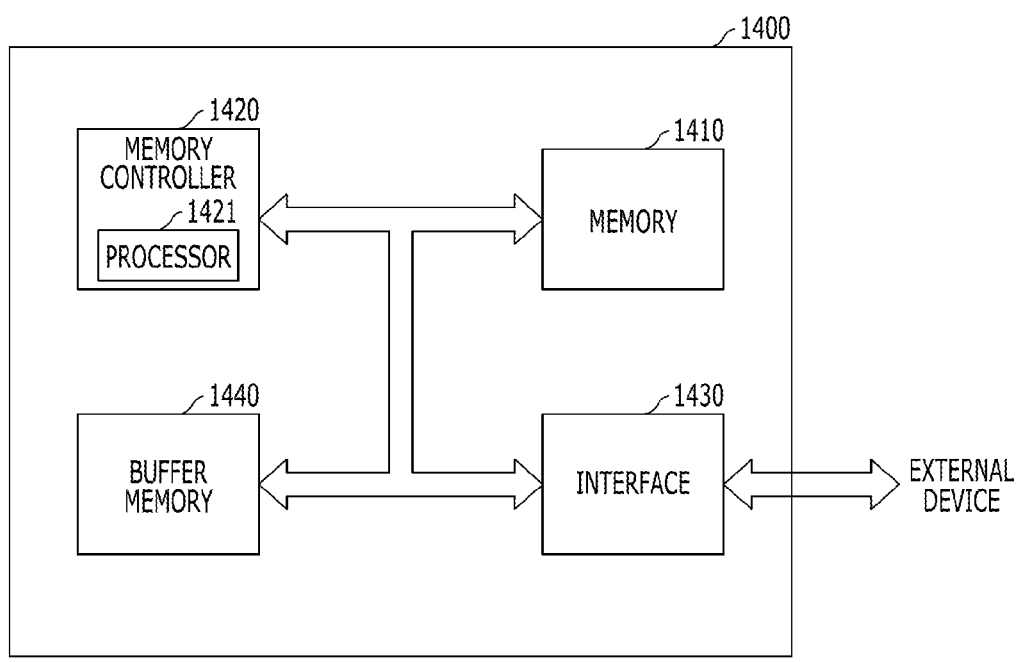
FIG. 15 illustrates a configuration of a memory system including a semiconductor device in accordance with an embodiment of the present disclosure.

FIG. 15 illustrates a configuration diagram of a memory system including a semiconductor device in accordance with an embodiment of the present disclosure.

Referring to FIG. 15, the memory system 1400 includes a memory 1410 which has a nonvolatile characteristic as a component for storing data, a memory controller 1420 which controls the memory 1410, and an interface 1430 for connection with an external device. The memory system 1400 may be a card type device such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The memory 1410 may include one or more semiconductor devices in accordance with embodiments of the present disclosure. For example, the memory 1410 may include an odd-numbered layer structure and an even-numbered layer structure over a substrate. The odd-numbered layer structure and the even-numbered layer structure are stacked. If there is more than one odd-numbered layer structure, the odd-numbered layer structures alternate with one or more even-numbered layer structures. The odd-numbered layer structure includes a plurality of first lines which extend in a first direction. The even-numbered layer structure includes a plurality of second lines which extend in a second direction crossing the first direction. The odd-numbered layer structures and the even-numbered layer structure further include resistance variable layers interposed between the first lines, between the second lines, and between the first lines and the second lines. By implementing the memory 1410 with a semiconductor device that includes an odd-numbered layer structure and an even-numbered layer structure, a fabrication process of the memory 1410 may be simplified, and a degree of integration of the memory 1410 may be increased. As a consequence, a size of the memory system 1400 may be reduced, and a data storage characteristic of the memory system 1400 may be improved.

The memory 1410 may further include any of a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. The memory controller 1420 may include a processor 1421 for performing an operation for and processing commands inputted through the interface 1430 from an outside of the memory system 1400.

The interface 1430 performs exchange of commands and data between the memory system 1400 and the external device. The interface 1430 may be compatible with other interfaces which are used in devices such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. The interface 1430 may be compatible with one or more different types of interfaces.

The memory system 1400 further includes a buffer memory 1440 for efficiently transferring data between the interface 1430 and the memory 1410 according to diversification and high performance of an interface with an external device, a memory controller, and a memory system. For example, the buffer memory 1440 may include one or more semiconductor devices in accordance with embodiments of the present disclosure. Therefore, a fabrication process of the buffer memory 1440 may be simplified, and a degree of integration of the buffer memory 1440 may be increased. As a consequence, a size of the memory system 1400 may be reduced, and a data storage characteristic of the memory system 1400 may be improved.

The buffer memory 1440 may further include a volatile memory, such as an SRAM (static random access memory), a DRAM (dynamic random access memory), or the like, and/or a nonvolatile memory, such as a phase change random access memory (PRAM), a resistive random access memory (RRAM), a spin transfer torque random access memory (STTRAM), a magnetic random access memory (MRAM), or the like.

In another embodiment, the buffer memory 1440 may not include a semiconductor device according to an embodiment of the present disclosure. Instead, the buffer memory 1440 only includes the volatile memory and/or the nonvolatile memory.

Features of embodiments of electronic devices or systems shown in FIGS. 11-15, which include one or more semiconductor devices according to embodiments of the present disclosure may be implemented in various devices, systems, or applications, which include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities, and so on.

While the present disclosure contains many embodiments, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in the present disclosure should not be understood as requiring such separation in all embodiments.

Only a few implementations and examples are described. Other implementations, enhancements, and variations can be made based on what is described and illustrated in the present disclosure.

What is claimed is:

1. An electronic device comprising:
    a semiconductor memory, wherein the semiconductor memory comprises:
        an odd-numbered layer structure disposed over a substrate and including a plurality of first lines which extend in a first direction;
        an even-numbered layer structure disposed over the substrate and including a plurality of second lines which extend in a second direction crossing the first direction; and
        resistance variable layers interposed between the first lines to be in contact with the first lines, between the second lines to be in contact with the second lines, and between the first lines and the second lines to be in contact with both the first lines and the second lines,
    wherein the odd-numbered layer structure and the even-numbered layer structure are alternately stacked over the substrate.

2. The electronic device according to claim 1, wherein the resistance variable layer between the first lines and the second lines are switched between different resistance states depending on voltages or currents applied to the first lines and the second lines.

3. The electronic device according to claim 1, wherein memory cells of the semiconductor memory are formed at respective crossing regions of the first lines and the second lines.

4. The electronic device according to claim 1,
    wherein the resistance variable layer between the first lines isolates the first lines from one another, and
    wherein the resistance variable layer between the second lines isolates the second lines from one another.

5. The electronic device according to claim 1,
    wherein the first lines or the second lines comprise even lines and odd lines that are alternately disposed in the same layer structure,
    wherein the even lines have the same shape, and
    wherein the odd lines have the same shape.

6. The electronic device according to claim 5, wherein one of each even line or each odd line has a tapered profile in which a width gradually increases in a downward direction, and the other of each even line or each odd line has a tapered profile in which a width gradually decreases in the downward direction.

7. The electronic device according to claim 1,
    wherein the first lines or the second lines comprise even lines and odd lines which are alternately disposed in the same layer structure, and
    wherein the resistance variable layers comprise an even resistance variable layer which is aligned with each of the even lines and disposed under each of the even lines and an odd resistance variable layer which covers sidewalls and a bottom surface of each of the odd lines.

8. The electronic device according to claim 7, further comprising:
    a spacer interposed between the odd resistance variable layer and both of the even resistance variable layer and the even line.

9. The electronic device according to claim 1, wherein the resistance variable layers comprise an oxygen-rich metal oxide layer and an oxygen-deficient metal oxide layer.

10. A method for fabricating an electronic device including a semiconductor memory, the method comprising:
    forming a first layer structure over a substrate, wherein forming the first layer structure comprises:
        forming first even lines extending in a first direction over a substrate;
        forming first odd resistance variable layers in first trenches defined between the first even lines, each of the first odd resistance variable layers being formed along sidewalls and a bottom surface of each of the first trenches; and
    forming first odd lines to fill the first trenches in which the first odd resistance variable layers are formed; and
        forming a second layer structure over the first layer structure, wherein forming the second layer structure comprises:
            forming second even resistance variable layers and second even lines which are stacked over the first layer structure, wherein each of the second even resistance variable layers and a corresponding one of the second even line extend in a second direction crossing the first direction and are aligned with each other;

forming second odd resistance variable layers in second trenches defined between the second even lines, each of the second odd resistance variable layers being formed along sidewalls and a bottom surface of each of the second trenches; and forming second odd lines to fill the second trenches in which the second odd resistance variable layers are formed.

11. The method according to claim 10, wherein the forming of the first odd resistance variable layers and the first odd lines comprises:

forming a resistance variable material layer along a profile of a resultant structure including the first even lines;

forming a conductive material layer over the resistance variable material layer; and performing a planarization process on a resultant structure including the conductive material layer until the first even lines are exposed.

12. The method according to claim 10, wherein the forming of the second odd resistance variable layers and the second odd lines comprises:

forming a resistance variable material layer along a profile of a resultant structure including the second even resistance variable layers and the second even lines;

forming a conductive material layer over the resistance variable material layer; and performing a planarization process on a resultant structure including the conductive material layer until the second even lines are exposed.

13. The method according to claim 10, further comprising:

forming first even resistance variable layers under the first even lines, each of the first even resistance variable layers being aligned with each of the first even lines.

14. The method according to claim 13, further comprising forming one or more additional layer structures over the second layer structure, each of the one or more additional layer structures including lines that extend in the first or second direction to cross a direction of lines of an underlying layer structure.

15. The method according to claim 10, wherein, before forming the second odd resistance variable layers, forming the second layer structure further comprises:

forming spacers on sidewalls of a stack structure of each of the second even resistance variable layers and a corresponding one of the second even lines.

16. The method according to claim 13, wherein, before forming the first odd resistance variable layers, forming the first layer structure further comprises:

forming spacers on sidewalls of a stack structure of each of the first even resistance variable layers and a corresponding one of the first even lines.

17. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

18. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

19. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

20. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

21. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *